US006567760B1

(12) United States Patent
Kikuchi et al.

(10) Patent No.: US 6,567,760 B1
(45) Date of Patent: May 20, 2003

(54) ELECTRO-OPTIC SAMPLING OSCILLOSCOPE

(75) Inventors: Jun Kikuchi, Tokyo (JP); Nobuaki Takeuchi, Tokyo (JP); Yoshiki Yanagisawa, Tokyo (JP); Nobukazu Banjo, Tokyo (JP); Yoshio Endou, Tokyo (JP); Mitsuru Shinagawa, Tokyo (JP); Tadao Nagatsuma, Tokyo (JP); Junzo Yamada, Tokyo (JP)

(73) Assignees: Ando Electric Co., Ltd., Tokyo (JP); Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/300,288

(22) Filed: Apr. 27, 1999

(30) Foreign Application Priority Data

May 6, 1998 (JP) ............................................. 10-123657

(51) Int. Cl.[7] ................................................ G06F 17/00
(52) U.S. Cl. ............................ 702/67; 702/66; 702/68; 702/70
(58) Field of Search ............................... 702/66–68, 70, 702/73, 74, 80, 57, 108, 117–126, 65, 187, 183, FOR 103, FOR 104, FOR 110, FOR 134, FOR 170, FOR 171; 345/440, 771, 970; 324/753, 750, 752, 96, 76.15, 76.24, 76.42, 76.36, 117 R, 73.1; 359/245, 246, 251, 252, 257, 249, 248; 250/214 AG, 214 A, 214 R, 225

(56) References Cited

U.S. PATENT DOCUMENTS 5,081,592 A  1/1992  Jenq .............................. 702/68
5,309,556 A  5/1994  Sismilich .................... 345/771

FOREIGN PATENT DOCUMENTS

| EP | 0264199 A1 | 4/1988 |
| EP | 0416731 A2 | 3/1991 |
| JP | 5-40158 | 2/1993 |
| JP | 5-47883 | 2/1993 |
| JP | 5-72299 | 3/1993 |

(List continued on next page.)

OTHER PUBLICATIONS

M. Shinagawa, et al., "A High–Impedence Probe Based on Electro–Optic Sampling", Proceedings of 15th Meeting on Lightwave Sensing Technology, LST 15–17, May 1995 (No Translation).
M. Shinagawa, et al., "An Automated Electro–Optic Probing System for Ultra–High–Speed IC's," pp. 843–847, copyright 1994 IEEE. (No month).

Primary Examiner—Hal Wachsman
(74) Attorney, Agent, or Firm—Burns, Doane, Swecker & Mathis L.L.P.

(57) ABSTRACT

An electro-optic sampling oscilloscope (or EOS oscilloscope) uses an electro-optic probe containing an electro-optic crystal, which is placed under effect of an electric field caused by a measured signal. Laser pulses are supplied to the electro-optic crystal wherein they are subjected to polarization. Then, measurement data representative of a waveform of the measured signal are produced in response to polarization states of the laser pulses and are stored in a measurement data storage. A user can select specific measurement data by using a list of files of multiple measurement data which is displayed on a screen. Then, the EOS oscilloscope displays an outline waveform which is created based on a reduced number of sample points extracted from the selected measurement data. Comments and/or measurement conditions can be stored in the measurement data storage in relation to the measurement data, so that they are adequately displayed on the screen.

23 Claims, 11 Drawing Sheets

U.S. PATENT DOCUMENTS

| | | | | |
|---|---|---|---|---|
| 5,479,643 A | * | 12/1995 | Bhaskar et al. | 345/970 |
| 5,526,473 A | * | 6/1996 | Patel | 345/440 |
| 5,550,963 A | * | 8/1996 | Siegel et al. | 345/440 |
| 5,579,462 A | | 11/1996 | Barber et al. | 345/440 |
| 5,579,463 A | * | 11/1996 | Takano et al. | 345/440 |
| 5,861,882 A | * | 1/1999 | Sprenger et al. | 345/970 |
| 5,935,187 A | * | 8/1999 | Trsar et al. | 702/67 |
| 6,229,536 B1 | * | 5/2001 | Alexander et al. | 345/440 |

FOREIGN PATENT DOCUMENTS

| | | |
|---|---|---|
| JP | 5-80083 | 3/1993 |
| JP | 5-240895 | 9/1993 |
| JP | 6-94807 | 4/1994 |
| JP | 7-55497 | 3/1995 |
| JP | 7-55891 | 3/1995 |
| JP | 8-43499 | 2/1996 |
| JP | 8-152361 | 6/1996 |
| JP | 8-160110 | 6/1996 |
| JP | 8-262117 | 10/1996 |
| JP | 9-159733 | 6/1997 |
| JP | 9-197019 | 7/1997 |
| JP | 9-211035 | 8/1997 |

* cited by examiner

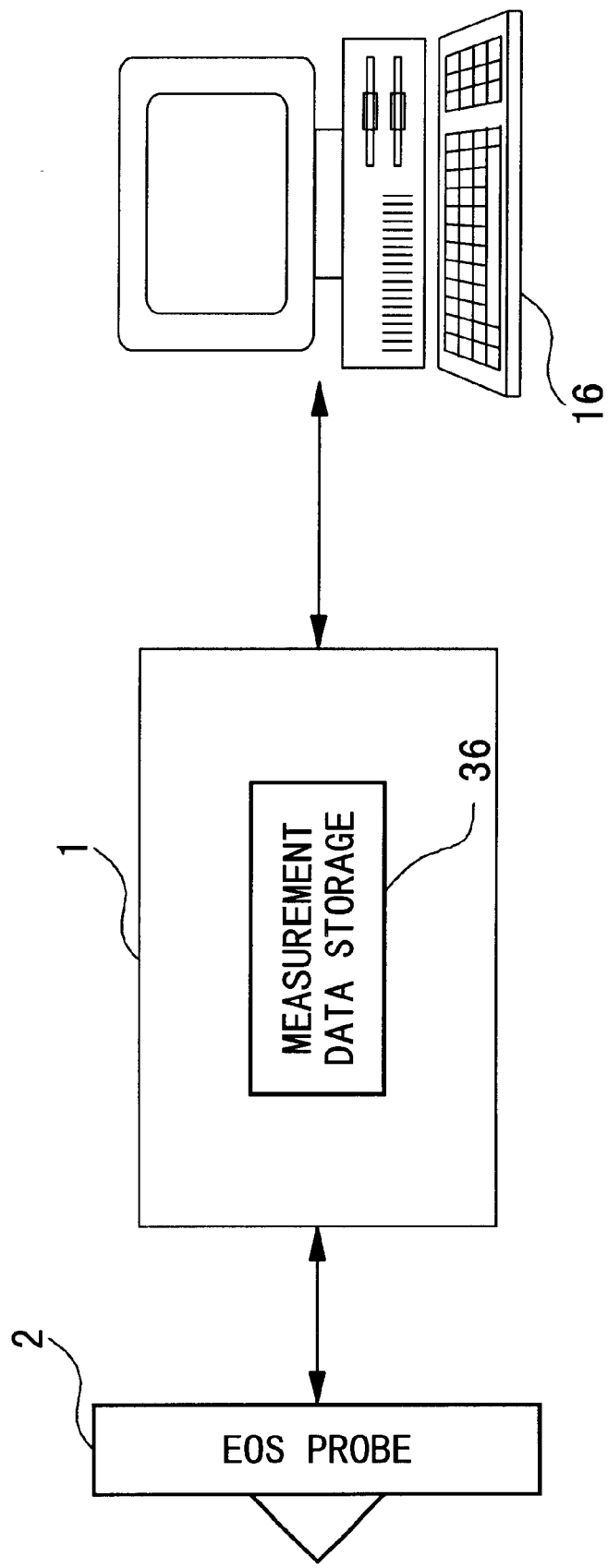

ELECTRO-OPTIC SAMPLING OSCILLOSCOPE

BACKGROUND OF THE INVENTION

1. Field of the Invention

This invention relates to electro-optic sampling oscilloscopes which use electro-optic probes to produce waveforms representative of measured signals. Herein, the electro-optic probes detect polarization states of laser beams (or laser pulses) incident on electro-optic crystals, which are placed under effects of electric fields caused by the measured signals.

2. Description of the Related Art

Conventionally, the electro-optic sampling oscilloscopes are used to provide visual display of waveforms of measured signals by using electro-optic probes, which operate in accordance with the known electro-optical phenomenon as follows:

Electric field caused by the measured signal is connected with an electro-optic crystal, on which laser beams are incident. Thus, it is possible to visually display the waveform of the measured signal in response to polarization states of the laser beams. Herein, the laser beams are made in a pulse-like form by which the measured signal is subjected to sampling. Thus, it is possible to measure the waveform of the measured signal with very high resolution with respect to time.

Engineers pay great attention to the aforementioned electro-optic sampling oscilloscopes (which are abbreviated by "EOS oscilloscopes", for example). This is described in a variety of papers such as the paper entitled "A High-Impedance Probe Based on Electro-Optic Sampling", which is written by Mr. Shinagawa and other members for the Proceedings of 15th Meeting on Lighwave Sensing Technology on pp. 123–129 of the collection of monographic papers for the Institutes of Applied Physics and Lightwave Sensing Technology, which is published on May of the year 1995. Because, as compared with the conventional sampling oscilloscopes using electric probes, the electro-optic sampling oscilloscopes have a variety of technical features, as follows:

(1) Because the EOS oscilloscope does not need the ground line when measuring signals, it is possible to perform measurement with ease.

(2) Because a metal pin (or metal needle tip) located at a tip end of the electro-optic probe is insulated from circuitry, it is possible to actualize a high input impedance, which does not substantially disturb a state of a measured point.

(3) Because the EOS oscilloscope uses optical pulses, it is possible to perform broad-band measurement up to the Giga-Heltz (GHz) order.

By the way, the EOS oscilloscopes display measured data in a simple way, as follows:

That is, the EOS oscilloscope simply displays the waveform of the measured data during the measurement or just after the measurement. Or, the measured data produced by the EOS oscilloscope are input to the personal computer or else, wherein general-purpose software is used to merely display numerical values of the measured data or waveform of the measured data.

As described above, the EOS oscilloscope has a capability to produce the measured data with high precision. However, the conventional technology does not provide an appropriate way of display in which a human operator (e.g., user) is capable of grasping the content of the measured data at a glance. In addition, it does not provide an appropriate environment of display in which the human operator is capable of comparing the measured data and measurement conditions with ease.

SUMMARY OF THE INVENTION

It is an object of the invention to provide an electro-optic sampling oscilloscope by which a user is capable of grasping content of measured data at a glance.

It is another object of the invention to provide an electro-optic sampling oscilloscope which provides a user with an appropriate environment of display in which the user is capable of comparing measured data and measurement conditions with ease.

In general, an electro-optic sampling oscilloscope (or EOS oscilloscope) uses an electro-optic probe containing an electro-optic crystal, which is placed under effect of an electric field caused by a measured signal. Laser pulses are supplied to the electro-optic crystal wherein they are subjected to polarization. Then, measurement data representative of a waveform of the measured signal are produced in response to polarization states of the laser pulses and are stored in a measurement data storage.

The EOS oscilloscope of this invention is characterized by providing user friendly display processing. Herein, a user is capable of selecting specific measurement data by using a list of files of multiple measurement data which is displayed on a screen. Then, the EOS oscilloscope displays an outline waveform which is created based on a reduced number of sample points extracted from the selected measurement data. In addition, it is possible to input comments and/or measurement conditions with respect to the measurement data. The comments and/or measurement conditions are stored in the measurement data storage in relation to the measurement data, so that they are adequately displayed on the screen. Further, it is possible to emphasize display of specific items of the measurement conditions, which the user is capable of designating and changing according to needs. Thus, the EOS oscilloscope provides a user friendly visual display for displaying the measurement data, measurement conditions, comments and outline waveforms on the screen.

Using such a visual display, the user is capable of grasping contents of the measurement data at a glance on the screen.

BRIEF DESCRIPTION OF THE DRAWINGS

These and other objects, aspects and embodiments of the present invention will be described in more detail with reference to the following drawing figures, of which:

FIG. 11 is a schematic diagram showing a configuration of an EOS oscilloscope system in accordance with embodiment 4.

DESCRIPTION OF THE PREFERRED EMBODIMENT

This invention will be described in further detail by way of examples with reference to the accompanying drawings.

At first, a description will be given with respect to an outline of overall operation of an EOS oscilloscope containing a display processing unit of measured data.

Figure 1:
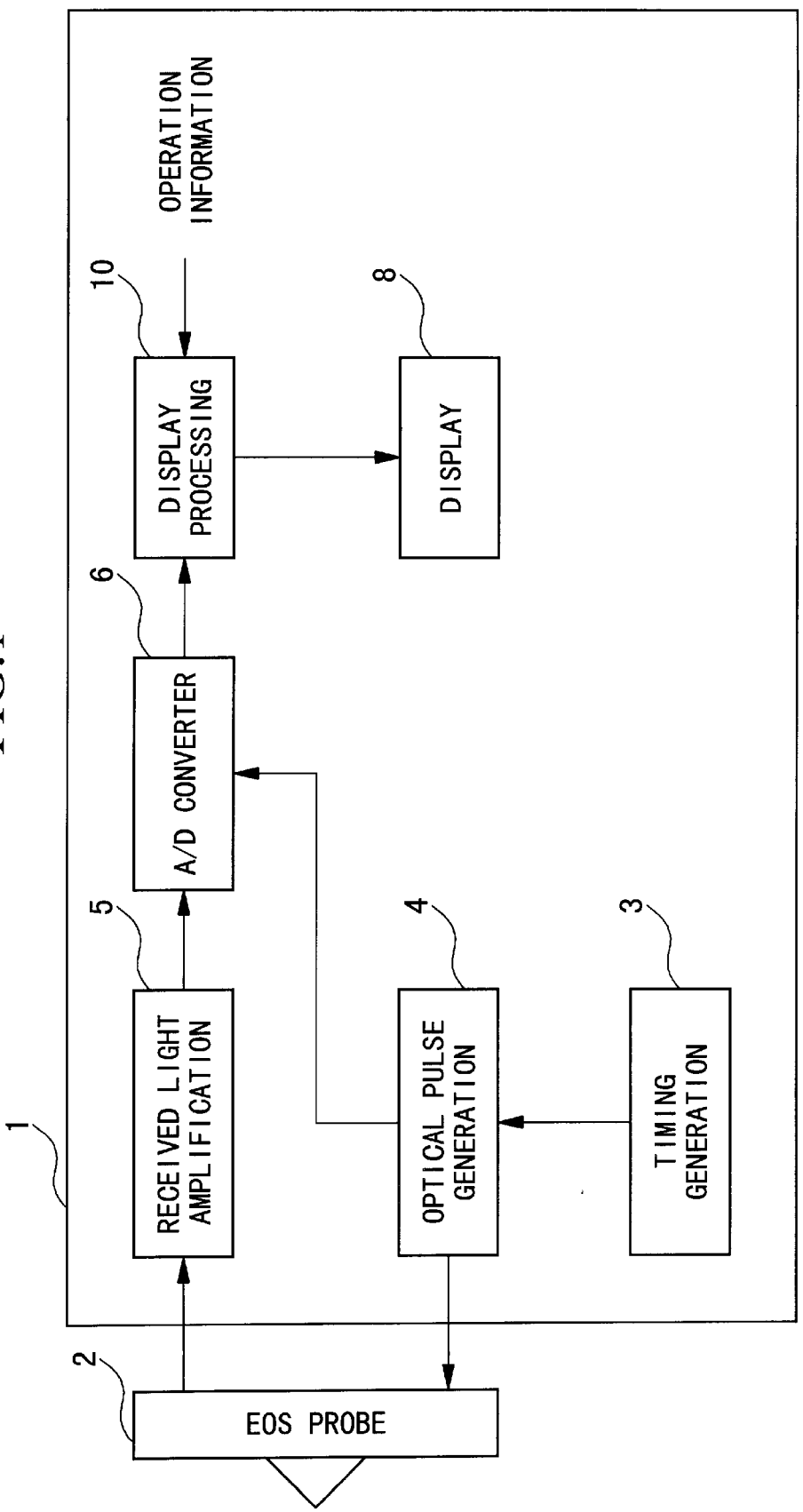
FIG. 1 is a block diagram showing a basic configuration of an electro-optic sampling oscilloscope in accordance with this invention.

FIG. 1 is a block diagram showing a basic configuration of the EOS oscilloscope which is designed in accordance with this invention.

The EOS oscilloscope of FIG. 1 is mainly configured by a main body 1 and an EOS probe 2. Herein, the main body 1 of the EOS oscilloscope is provided to perform signal processing on measured data. The EOS probe 2 containing an electro-optic crystal uses optical pulses (or laser beams) to measure electric fields generated by measured signals.

The main body 1 of the EOS oscilloscope is configured by a timing generation circuit 3, an optical pulse generation circuit 4, a received light amplification circuit 5, an analog-to-digital converter (abbreviated by "A/D converter") 6, a display unit 8 and a display processing unit 10. Herein, the timing generation circuit 3 generates timing signals representing sampling timings based on trigger signals used for establishing synchronization with measured signals. The optical pulse generation circuit 4 generates optical pulses based on the timing signals generated by the timing generation circuit 3. The received light amplification circuit 5 receives polarized optical pulses which are given from the EOS probe 2. So, it outputs electric signals in response to amounts of polarization effected on the optical pulses. The A/D converter 6 performs analog-to-digital conversion on the electric signals, output from the received light amplification circuit 5, at prescribed timings. Thus, it produces measurement data representing measurement results, which are forwarded to the display processing unit 10. The display processing unit 10 performs display processes on the measurement data. Then, the display unit 8 displays content of the measurement data. Incidentally, it is possible to modify the present embodiment such that the display unit 8 is not contained in the main body 1 of the EOS oscilloscope. That is, the display unit 8 can be configured as an external display which is connected to the main body 1 of the EOS oscilloscope by means of connectors, for example.

Next, the description will be given with respect to the outline of the overall operation of the EOS oscilloscope of FIG. 1.

At first, a trigger signal is input to the EOS oscilloscope from the external (e.g., external device or system). In response to the trigger signal, the timing generation circuit 4 generates a timing signal representing a sampling timing. Incidentally, the timing that the timing generation circuit 4 outputs the timing signal depends on measurement conditions.

In response to the timing signal output from the timing generation circuit 4, the optical pulse generation circuit 4 generates an optical pulse whose pulse width is relatively narrow and is set to 30 ps, for example. Such an optical pulse is supplied to the EOS probe 2.

In the EOS probe 2, the optical pulse is subjected to polarization due to electric field produced by a measured signal in the electro-optical crystal.

Then, the EOS probe 2 returns a polarized optical pulse to the main body 1 of the EOS oscilloscope. Thus, the received light amplification circuit 5 outputs an electric signal (i.e., received light signal) in response to an amount of polarization of the polarized optical pulse.

Based on the signal output from the optical pulse generation circuit 4, the A/D converter 6 performs analog-to-digial conversion on the received light signal, output from the received light amplification circuit 5, to produce a digital signal.

The display processing unit 10 inputs the digital signal from the A/D converter 6 so as to form a waveform of the measured signal. In addition, it produces measurement data, representing the waveform of the measured signal, which are stored in a measurement data storage (not shown). The measurement data storage is provided inside of the display processing unit 10. Incidentally, the display processing unit 10 performs a display process with respect to the "measured" waveform during execution of the measurement of the measured signal. The display processing unit 10 also stores measurement conditions in the measurement data storage in relation to the measurement data. The measurement data storage provides a file for every measurement data. A name of the file of the measurement data can be designated by the user in advance. Or, it can be determined automatically by the display processing unit 10 in accordance with a prescribed naming rule, for example.

It is possible to set a variety of measurement conditions for the EOS oscilloscope in response to control signals, which are produced by manipulation of an operation unit (or operation panel, not shown) or which is given from the external. Thus, the EOS oscilloscope of FIG. 1 performs measurement based on the measurement conditions which are set. As for the measurement conditions, it is possible to set conditions whether to set a LPF (i.e., low-pass filter) or a HPF (i.e., high-pass filter) for the measured signal(s), for example. In addition, there are provided measurement conditions exclusively used for the EOS oscilloscope, e.g., conditions for setting the measurement band, detection sensitivity and bias value for the laser diode. Herein, the condition for setting the "measurement band" is the measurement condition regarding the frequency band for amplification of an amplifier circuit of the received light amplification circuit 5. The condition for setting the "detection sensitivity" is the measurement condition regarding sensitivity of an electro-optical element of the EOS probe 2 and/or sensitivity of a received light circuit of the received light amplification circuit 5. Further, the condition for setting the "bias value of the laser diode" is the measurement condition regarding the bias value effected on the laser diode of the optical pulse generation circuit 4 for adjusting an amount of light emission.

As described above, the EOS oscilloscope operates so that the measurement data are sequentially stored in the measurement data storage.

Next, contents of measurement data display processes, which are performed after detection of the measurement data by the display processing unit 10, will be described with respect to several embodiments.

[A] Embodiment 1

Figure 2:
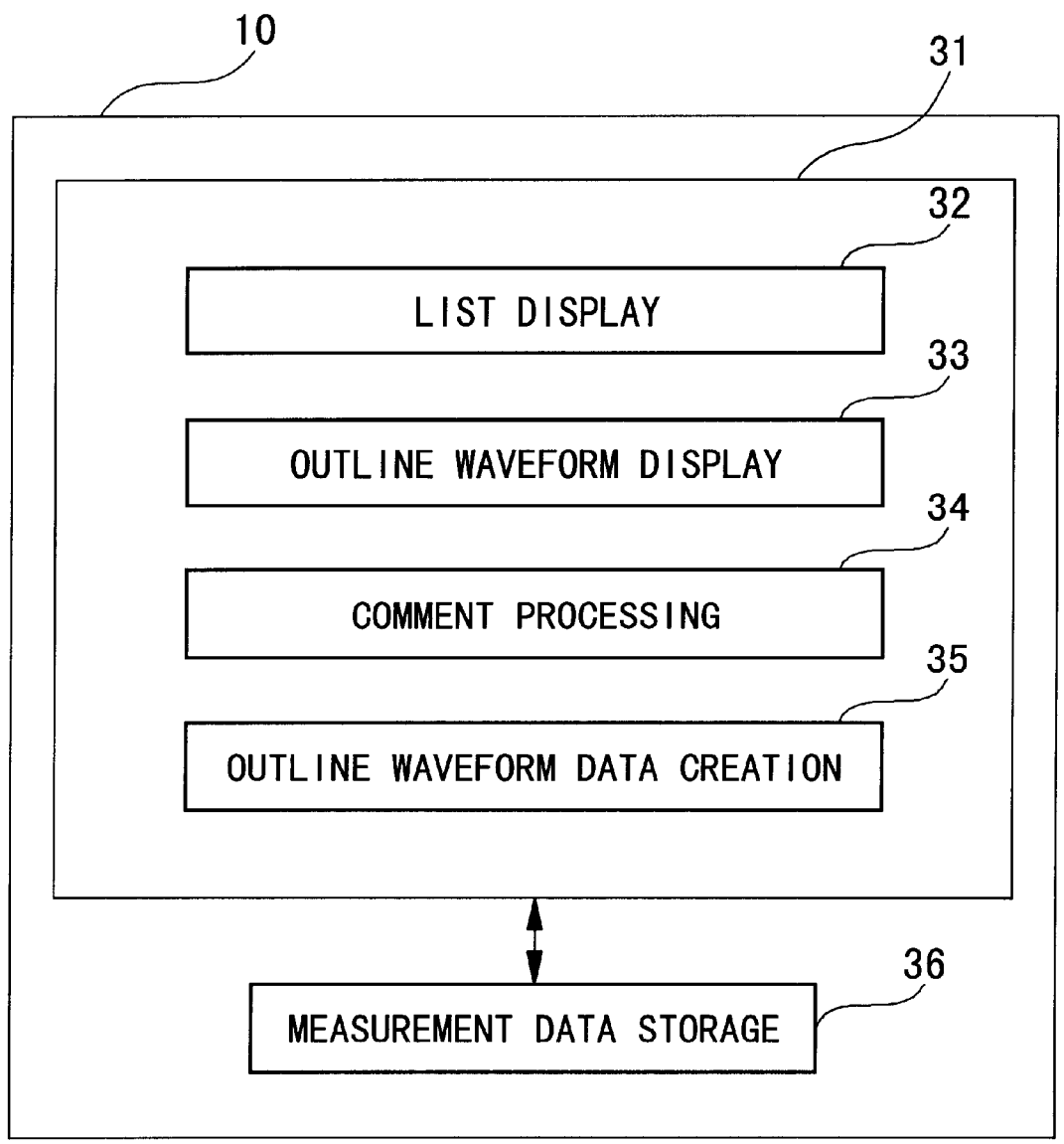
FIG. 2 is a block diagram showing an internal configuration of a display processing unit shown in FIG. 1 in accordance with embodiment 1 of the invention.

FIG. 2 is a block diagram showing a detailed internal configuration of the display processing unit 10, provided inside of the main body 1 of the EOS oscilloscope of FIG. 1, in accordance with embodiment 1 of the invention.

The display processing unit 10 of FIG. 2 is basically configured by a data processor 31 and a measurement data storage 36. Herein, the data processor 31 performs display processes on the "stored" measurement data. The measurement data storage 36 stores the measurement data as well as other data related to the measurement data. The data processor 31 is equipped with a list display section 32, an outline waveform display section 33, a comment processing section 34 and an outline waveform data creation section 35.

The list display section 32 performs a list display process to display a list of the files regarding the measurement data stored in the measurement data storage 36. Such a list display process enables the user to select the measurement data to be displayed.

The outline waveform display section 33 performs a display process to display an outline waveform which is created based on a reduced number of sample points (or sampling points) extracted from the selected measurement data.

The comment processing section 34 is activated when a comment is input with respect to the selected measurement data. Namely, the comment processing section 34 stores the comment in the measurement data storage 36 in relation to the measurement data.

The outline waveform data creation section 35 creates outline waveform data based on a reduced amount of the measurement data whose number of sample points is reduced. Then, the outline waveform creation section 35 stores the outline waveform data in the measurement data storage 36 in relation to the "original" measurement data.

The data processor 31 can be actualized by the "exclusively provided" hardware. Or, functions of the data processor 31 are actualized by a central processing unit (i.e., CPU, not shown) that executes programs.

The measurement data storage 36 is configured by the hard disk unit, floppy disk unit or non-volatile memory such as the flash memory, for example.

Figure 3:
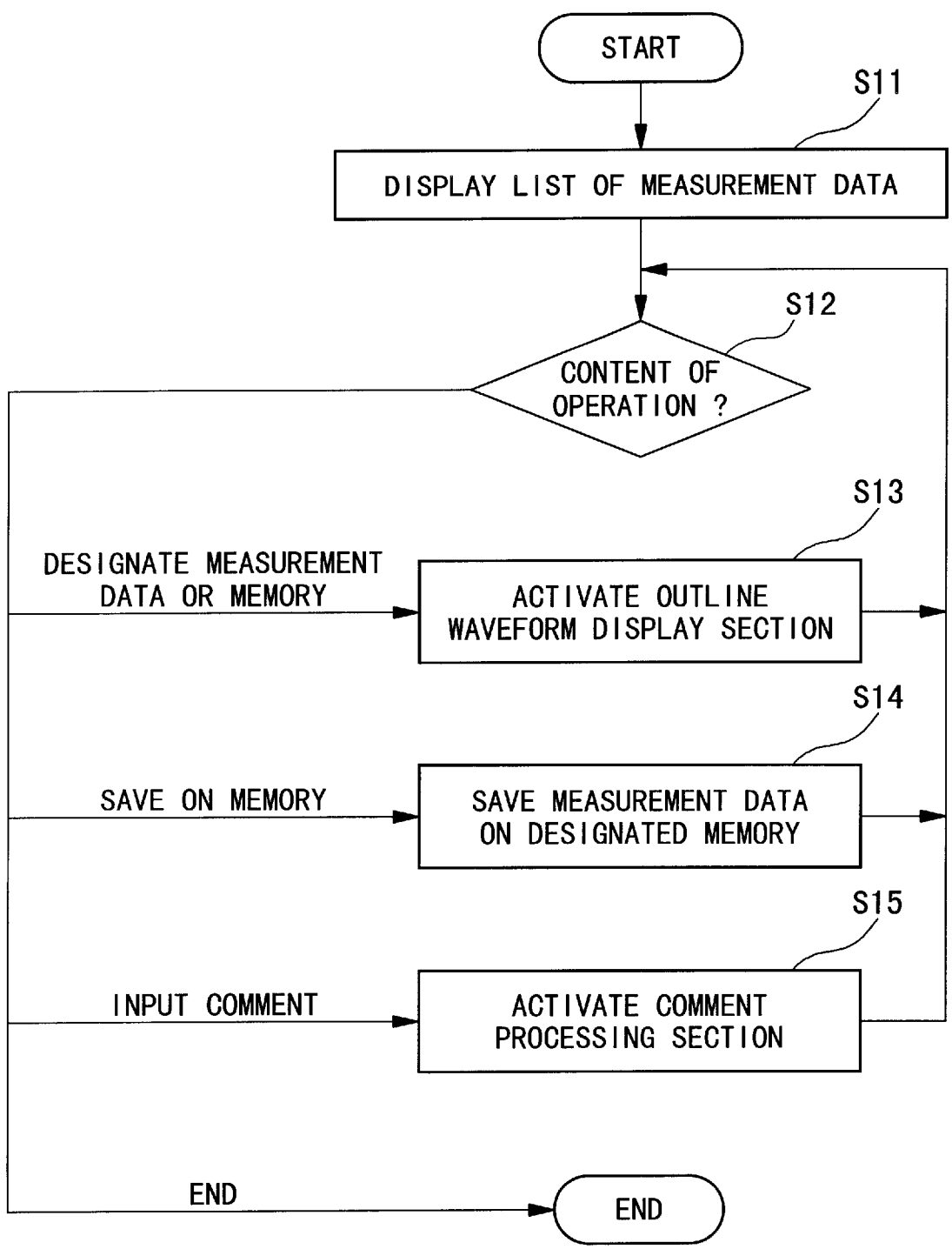
FIG. 3 is a flowchart showing operations of a data processor shown in FIG. 2.

Next, a description will be given in detail with respect to operations of the data processor 31 in the display processing unit 10. FIG. 3 is a flowchart showing the operations of the data processor 31 shown in FIG. 2.

In step S11, the list display section 32 searches through storage areas storing the measurement data within the measurement data storage 36. Thus, it displays a list of the files of the measurement data. Through the step S11, the display unit 8 displays on a screen thereof contents of display areas 61 to 64 shown in FIG. 5, which show an example of the displayed list. In case of the display example of FIG. 5, the display area 61 displays a directory configuration for storage of the measurement data stored in the measurement data storage 36, while the display area 62 displays file names of the measurement data. Using those areas, the user is capable of selecting the measurement data to be confirmed with ease.

In step S12, the data processor 31 operates to interpret content of operation which the user makes with the operation unit (not shown). So, the data processor 31 performs a process in response to such content of operation.

Figure 5:
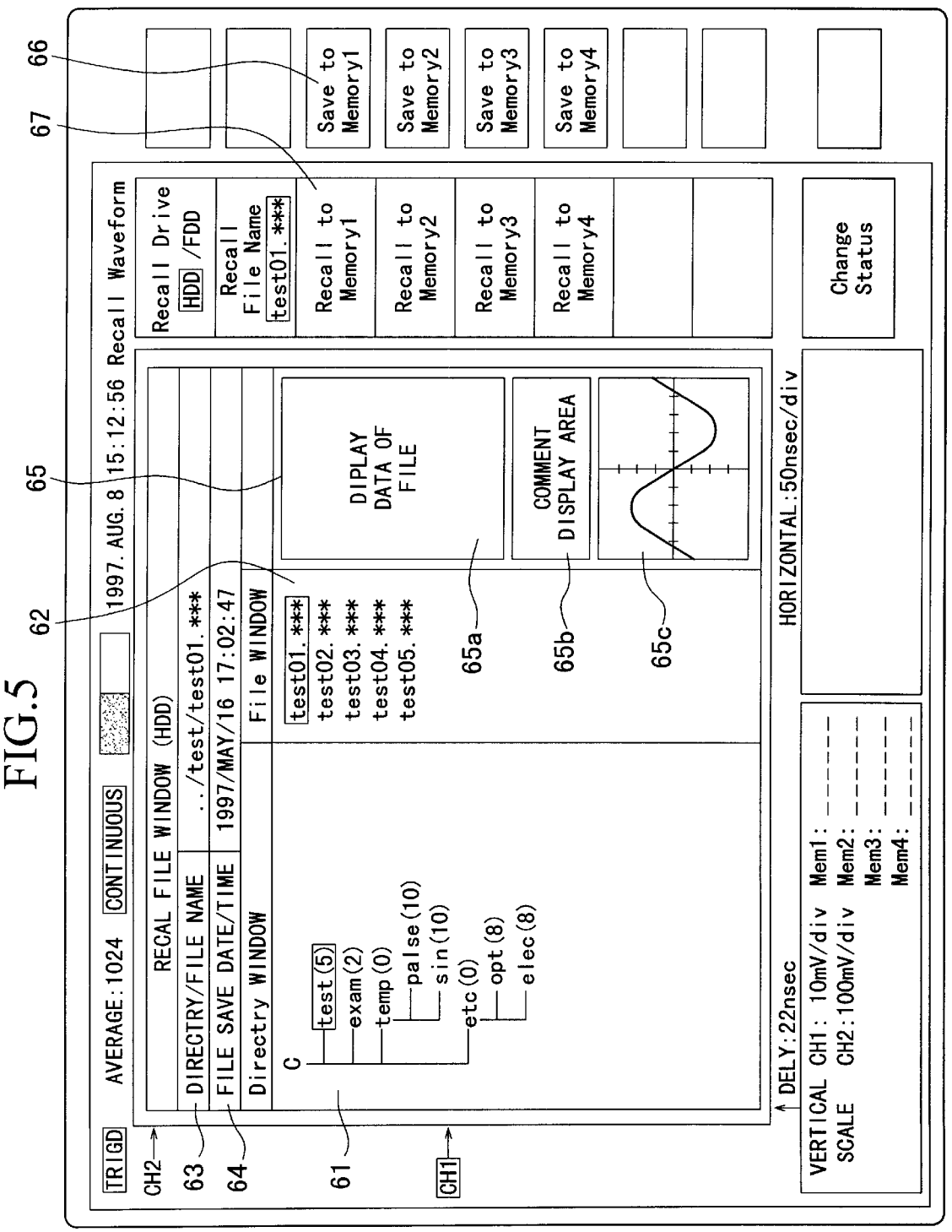
FIG. 5 shows an example of images which are displayed on a screen in connection with the embodiment 1.

Suppose that the content of operation corresponds to an operation to "designate measurement data", wherein the data processor 31 designates a file of the measurement data within the files displayed on the display area 62 shown in FIG. 5. In that case, the data processor 31 transfers control to step S13. That is, the data processor 31 activates the outline waveform display section 33 to display an outline of a waveform of the measurement data which are designated. In addition, the data processor 31 transfers a file name of the "designated" measurement data to the outline waveform display section 33. Through the step S13, the display unit 8 displays on the screen thereof content of data displayed on a display area 65 shown in FIG. 5. This display area 65 consists of three areas 65a, 65b and 65c. Herein, the area 65a displays numerical values of the measurement data. The area 65b displays content of a comment, which is stored in relation to the measurement data. The area 65c displays an outline waveform, by which the user is capable of roughly confirming an overall waveform of the measurement data. In this case, it is possible to activate display areas 63 and 64 as well. That is, the display area 63 displays the file name of the measurement data which are selected, while the display area 64 displays information regarding date and time to store the file. As described above, by displaying the outline waveform on the screen of the display unit 10, it is possible for the user to easily grasp contents of the "selected" measurement data. In other words, it is possible to increase an efficiency in selection of the measurement data which are required.

Next, suppose that the content of operation corresponds to an operation to "save on (or save to) memory" with respect to the measurement data which are selected. In that case, the data processor 31 proceeds to step S14, wherein it stores file information of the selected measurement data and/or content of the outline waveform, which is produced and displayed in the foregoing step S13, in a prescribed memory area (not shown). Thus, it is possible to speedily display the measurement data to be compared with other data. For example, the user clicks a button, designated by a reference symbol "66" in FIG. 5, with a mouse, so that information regarding the measurement data of the waveform presently displayed is saved (or stored) on "memory 1".

If the content of operation corresponds to an operation to "designate memory" wherein the data processor 31 selects the measurement data saved on the memory, the data processor 31 proceeds to step S13. Herein, the data processor 31 activates the outline waveform display section 33 to display an outline waveform of the measurement data on the basis of the measurement data of the memory. In addition, it transfers a number of the designated memory to the outline waveform display section 33. For example, the user clicks a button, designated by a reference symbol "67" in FIG. 5, with a mouse, so that the display unit 8 displays on the screen thereof outline waveform data regarding the measurement data saved on the memory 1.

If the content of operation corresponds to an operation to "input comment" wherein a comment is input with respect to the selected measurement data, the data processor 31 activates the comment processing section 34 to perform a comment process in step S15. In this case, the comment processing section 34 stores the input comment in the measurement data storage 36 in relation to the selected measurement data. Incidentally, there are provided a variety of methods how to relate the input comment to the measurement data, as follows:

The comment is stored in the measurement data storage 36 by using a file name of the measurement data added with a symbol representing the comment. Or, data of the comment are written into a file of the measurement data in such a way that they can be recognized.

Incidentally, other pieces of information related to the measurement data are also stored in the measurement data storage 36 in relation to the measurement data.

As described above, the present embodiment provides a capability to input the comment, which can be stored in relation to the measurement data. Thus, it is possible to immediately input the comment that the user becomes aware with respect to the selected measurement data. In addition, it is possible to confirm the content of the comment later. Thus, it is possible to provide an effective way for use of the measurement data.

The data processor 31 operates as described above.

Next, a description will be given with respect to operation of the outline waveform display section 33, which is activated in the foregoing step S13 shown in FIG. 3, with reference to a flowchart of FIG. 4.

In step S21, the outline waveform display section 33 displays numerical data of the selected measurement data on the basis of the information which is transferred thereto. Thus, the display unit 8 displays the numerical data of the display area 65a on the screen of the display unit 8.

In step S22, a confirmation is made as to whether there exist outline waveform data which are related to the selected measurement data or not.

If no outline waveform data exist, the outline waveform display section 33 activates the outline waveform data creation section 35 to create outline waveform data in step S23. Herein, the outline waveform data creation section 35 firstly determines a number of sample points for displaying an outline waveform on the basis of a total number of sample points of the selected measurement data and size of the display area to display the outline waveform. Next, the outline waveform data creation section 35 thins out a certain number of sample points to extract the "determined" number of sample points from the total number of sample points of the selected measurement data. Thus, the outline waveform data creation section 35 creates the outline waveform data, which are then stored in the measurement data storage 36 in relation to the selected measurement data.

In step S24, the outline waveform display section 33 uses the outline waveform data to display the outline waveform. Thus, it is possible to display a waveform on the display area 65c shown in FIG. 5.

Incidentally, if there exists the comment which is input in relation to the selected measurement data, the comment is displayed in step S25. Thus, it is possible to display the comment on the display area 65b shown in FIG. 5. In the present embodiment, the display area 65b is used as the area to display and input the comment.

The outline waveform display section 33 operates as described above.

As described above, the outline waveform data are created in the step S23 if no outline waveform data exist in advance. Thus, it is possible to perform a next display process of the outline waveform data with a high speed.

Incidentally, the foregoing step S21 to display the measurement data and the foregoing step S25 to display the comment are not essential steps for the outline waveform display section 33. In other words, those steps are optional. For this reason, it is possible to exclude one of or both of the comment processing section 34 and the outline waveform data creation section 35 from the data processor 31.

In the foregoing step S23, the outline waveform data are newly created when the measurement data are firstly selected. However, the present embodiment is not necessarily designed in such a manner. That is, the display processing unit 10 is capable of creating and storing the outline waveform data when storing the measurement data in the measurement data storage 36.

[B] Embodiment 2

The aforementioned embodiment 1 is designed to display a single outline waveform for the measurement data. The embodiment 2 is designed to provide an easy way in comparison of the selected measurement data, wherein it displays multiple outline waveforms for the measurement data.

Figure 6:
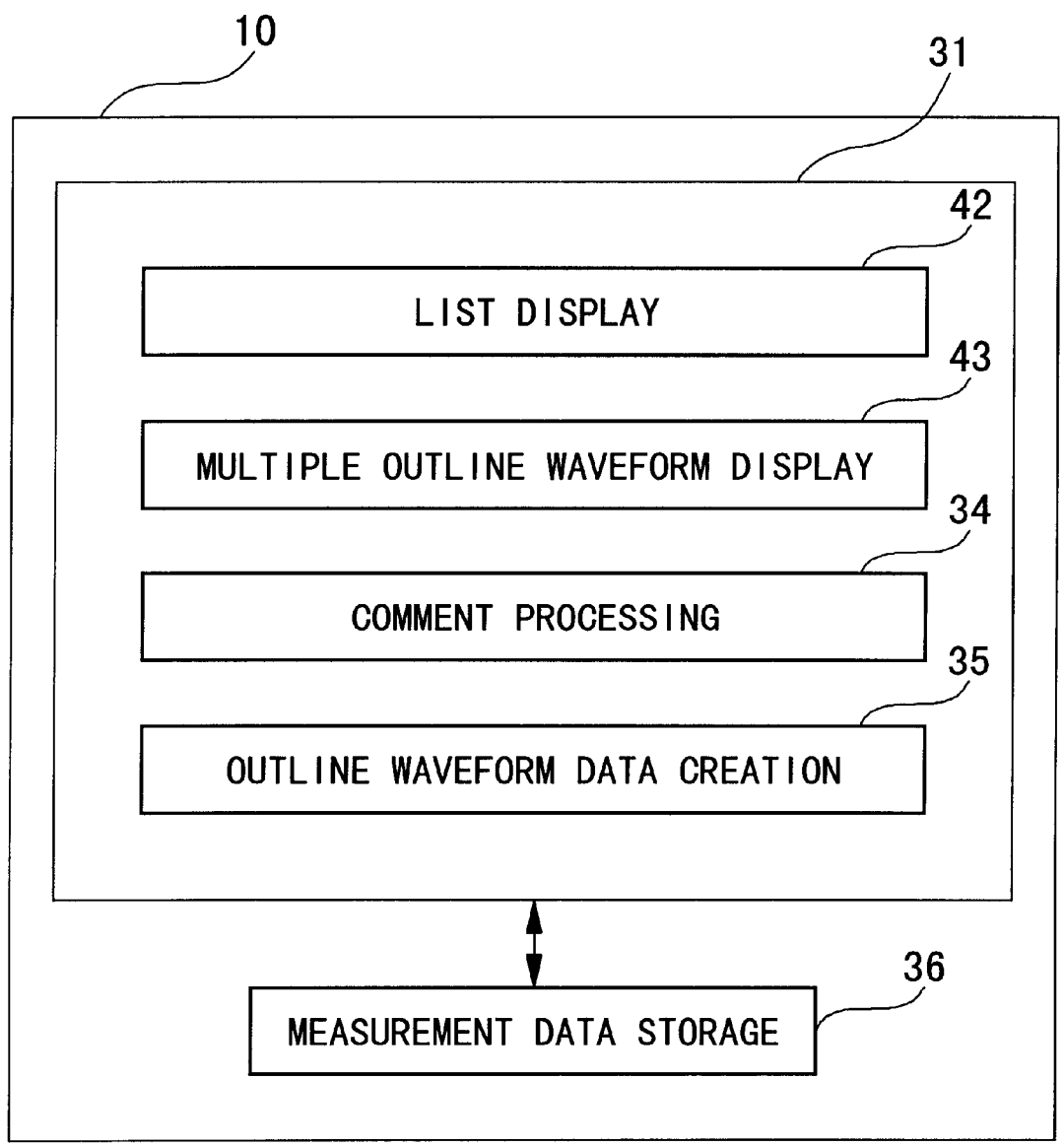
FIG. 6 is a block diagram showing a configuration of the display processing unit in accordance with embodiment 2 of the invention.

FIG. 6 is a block diagram showing a configuration of the display processing unit 10 of the main body 1 of the EOS oscilloscope shown in FIG. 1 in accordance with embodiment 2 of the invention. As compared with the aforementioned configuration of the display processing unit 10 of the embodiment 1 shown in FIG. 2, the display processing unit 10 of the embodiment 2 shown in FIG. 6 is characterized by providing a list display section 42 and a multiple outline waveform display section 43 instead of the aforementioned list display section 32 and the outline waveform display section 33. Herein, the list display section 42 is partially different in operation from the list display section 32. In addition, the multiple outline waveform display section 42 is provided to display multiple outline waveforms. In FIG. 6, parts identical to those shown in FIG. 2 are designated by the same reference symbols, hence, the description thereof will be omitted. So, the following description will be given mainly with respect to the differences between the configurations shown in FIG. 2 and FIG. 6.

Figure 7:
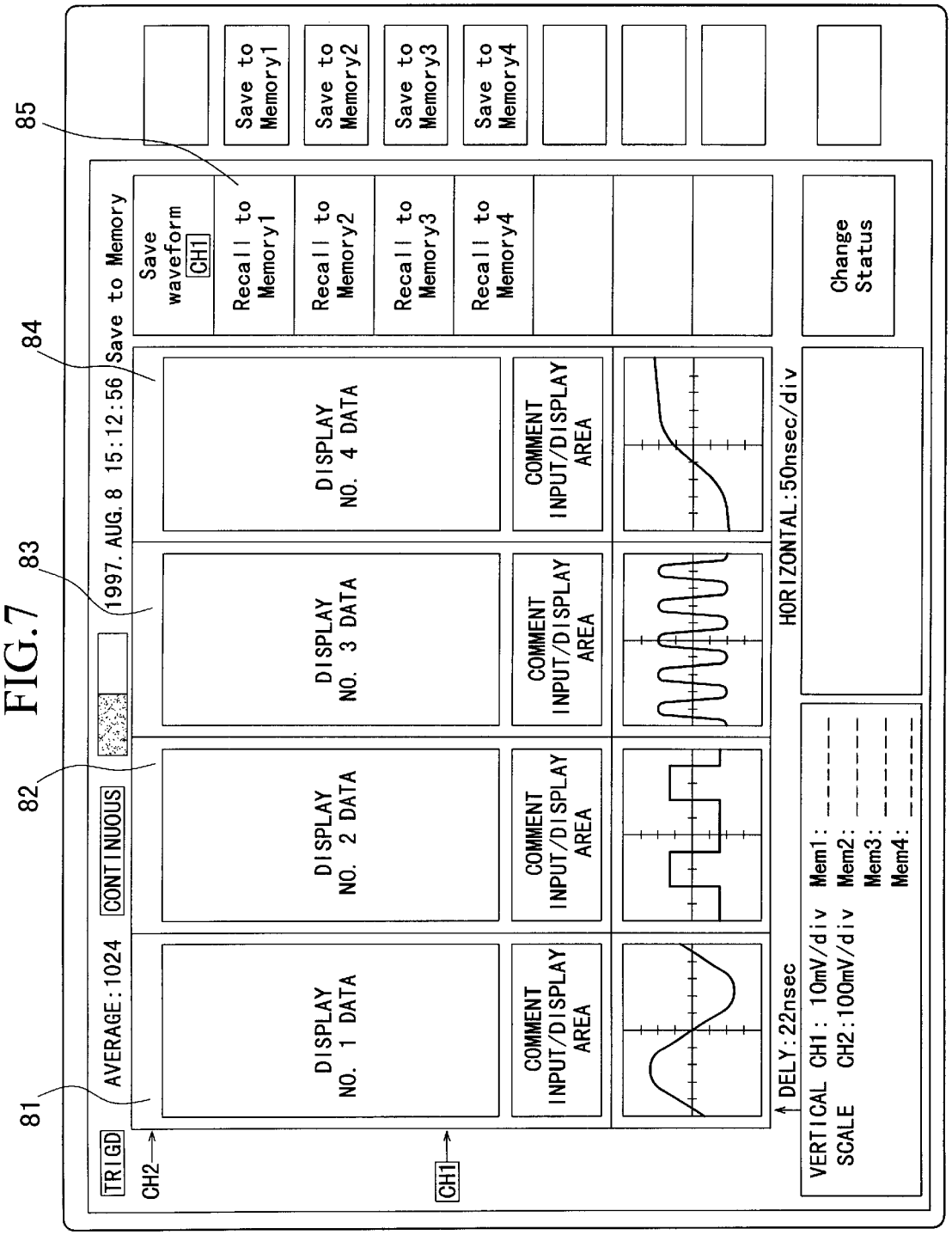
FIG. 7 shows an example of images which are displayed on the screen in connection with the embodiment 2.

An outline (overall) operation of the data processor 31 shown in FIG. 6 is approximately identical to the aforementioned operation which is explained with reference to the flowchart of FIG. 3. However, the content of the step S13 shown in FIG. 3 should be modified to cope with the embodiment 2. That is, the embodiment 2 should describe the step S13 such that the data processor 31 activates the multiple outline waveform display section 43 instead of the outline waveform display section 33. Thus, the display unit 8 displays images shown in FIG. 7 on the screen thereof. That is, the display unit 8 displays multiple waveforms with regard to multiple measurement data respectively. In the case of FIG. 7, the data processor 31 performs the step S11 (see FIG. 3) to display a list of the measurement data by using the aforementioned display areas 61 to 64 shown in FIG. 5. Unlike the display images of FIG. 5, those display areas 61 to 64 are displayed like pop-up windows which overlap with the display images of FIG. 7. Like the foregoing embodiment 1, the embodiment 2 is designed to perform the display process to display the list of the measurement data (see step S11 in FIG. 3) and selection process to select the file of the measurement data. Further, the embodiment 2 performs a display process to display items which can be displayed on any of display areas 81 to 84 in FIG. 7. Herein, it is possible to select the display area to display such item(s). Then, information regarding the selected display area is transferred to the multiple outline waveform display section 43. So, outline waveforms of the measurement data are respectively displayed on the areas designated by the multiple outline waveform display section 43.

Suppose that the user clicks a button designated by a reference symbol "85" in FIG. 7 with a mouse under the condition that the content of operation corresponds to the operation to "designate memory", the data processor 31 performs the selection process to select the display area. For example, when the user presses the button 85 in FIG. 7, the display unit 8 displays on the screen thereof a pop-up window that enables the user to select the display area. Using such a pop-up window, the user is capable of selecting the display area, so that information regarding the selected display area is transferred to the multiple outline waveform display section 43. Thus, the multiple outline waveform display section 43 displays the outline waveform of the measurement data on the selected display area.

Figure 4:
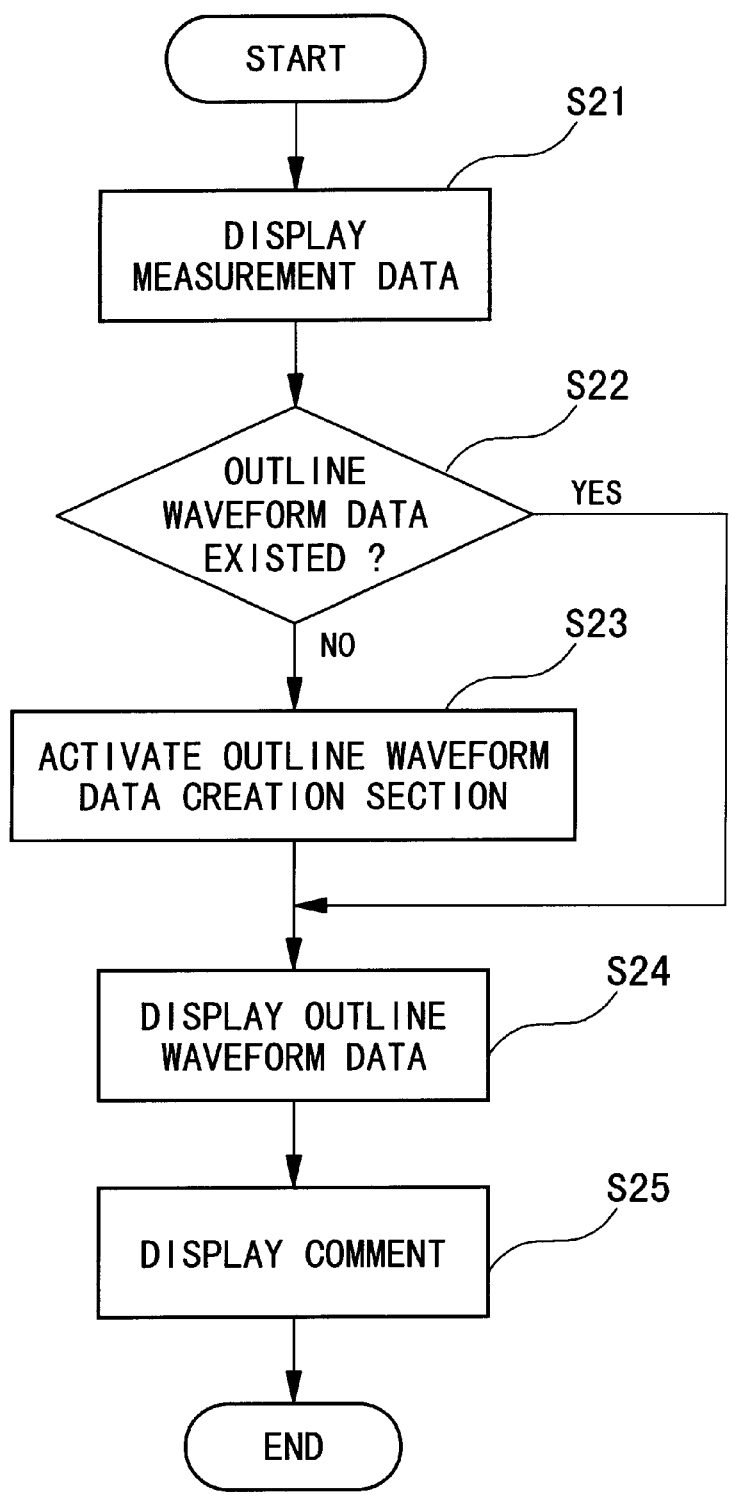
FIG. 4 is a flowchart showing operations of an outline waveform display section shown in FIG. 2.

As described above, an overall operation of the multiple outline waveform display section 43 used in the embodiment 2 is approximately identical to the content of the flowchart of FIG. 4 used by the embodiment 1. However, the embodiment 2 is different from the embodiment 1 in that the outline waveform is displayed on the "selected" display area.

Therefore, the embodiment 2 allows the user to perform comparison of the multiple measurement data with ease by displaying the multiple outline waveforms and the multiple measurement data in parallel on the screen.

Incidentally, the embodiment 1 can be modified to actualize functions of the embodiment 2. That is, the embodiment 1 provides an operation named "multiple display". When such an operation is selected, the multiple measurement data respectively saved on the multiple memories are sequentially displayed on the display areas 81 to 84 shown in FIG. 7.

[C] Embodiment 3

The embodiment 3 corresponds to a re-design of the display processing unit 10, which allows the user to perform comparison of the measurement conditions, which are stored in relation to the measurement data, with ease.

Figure 8:
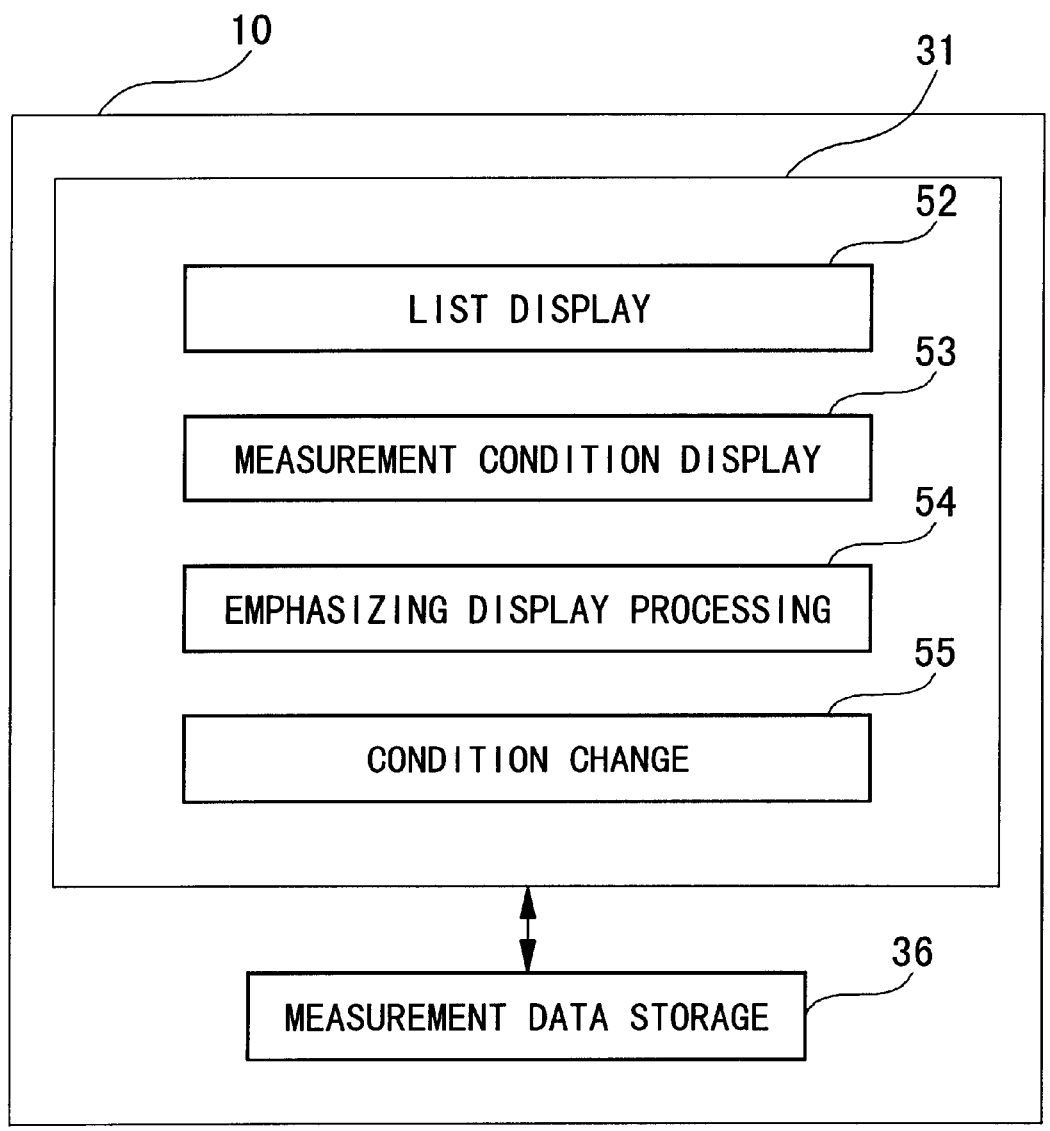
FIG. 8 is a block diagram showing a configuration of the display processing unit in accordance with embodiment 3 of the invention.

FIG. 8 is a block diagram showing a configuration of the display processing unit 10 of the main body 1 of the EOS oscilloscope of FIG. 1 in accordance with the embodiment 3 of the invention. The data processor 31 of the display processing unit 10 of the embodiment 3 is equipped with a list display section 52, a measurement condition display section 53, an emphasizing display processing section 54 and a condition change section 55.

The list display section 52 allows the user to select measurement data whose measurement conditions are displayed. In order to do so, the list display section 52 performs a list display process to display files of the measurement data stored in the measurement data storage 36.

The measurement condition display section 53 performs a display process to display the measurement conditions of the measurement data which are selected, wherein the measurement conditions are arranged with respect to each of the measurement data.

The emphasizing display processing section 54 performs comparison of the measurement conditions of the measurement data which are sequentially selected. Thus, the emphasizing display processing section 54 performs an emphasizing display process with respect to the measurement conditions which are subjected to the display process of the measurement condition display section 53. Herein, the emphasizing display processing section 54 emphasizes different parts between the measurement conditions of the measurement data which are compared with each other.

The condition change section 55 is activated when the user selects a certain measurement condition which is displayed in an emphasized manner by the emphasizing display processing section 54. Herein, the condition change section 55 performs a process to change the selected measurement condition.

In FIG. 8, parts identical to those shown in FIG. 2 are designated by the same reference symbols, hence, the description thereof will be omitted.

Next, an overall operation of the data processor 31 of the embodiment 3 will be described with reference to FIG. 9.

In step S31, the list display section 52 searches storage areas storing measurement data so as to display a list of files of the measurement data. For example, the display unit 8 displays on the screen thereof windows containing displayed contents of the display areas 61 to 64 shown in FIG. 5.

Next, the data processor 31 proceeds to step S32, wherein it allows the user to select measurement data, which is the basis for setting the measurement conditions. In addition, the selected measurement data are stored in the measurement data storage 36. Incidentally, the windows which are displayed by the foregoing step S31 contain a "select button" which allows the user to select the measurement data. In addition, those windows contain other "select buttons" with regard to "select items" which correspond to the measurement conditions presently set for the EOS oscilloscope. Those measurement conditions presently set are stored in a prescribed memory. So, it is possible for the user to refer to them according to needs.

In step S33, the data processor 31 makes the user to select "subject" measurement data to be compared with the measurement data. The subject measurement data are stored in the measurement data storage 36. In order to allow the user to select the subject measurement data to be compared with the measurement data, the windows displayed by the step S31 contain a "select button" which allows the user to select the subject measurement data. Incidentally, the embodiment 3 has a capability of allowing the user to select "multiple" measurement data for comparison. In that case, "select numbers" (or memory numbers) are respectively allocated to the multiple measurement data in an order to select them.

Figure 10:
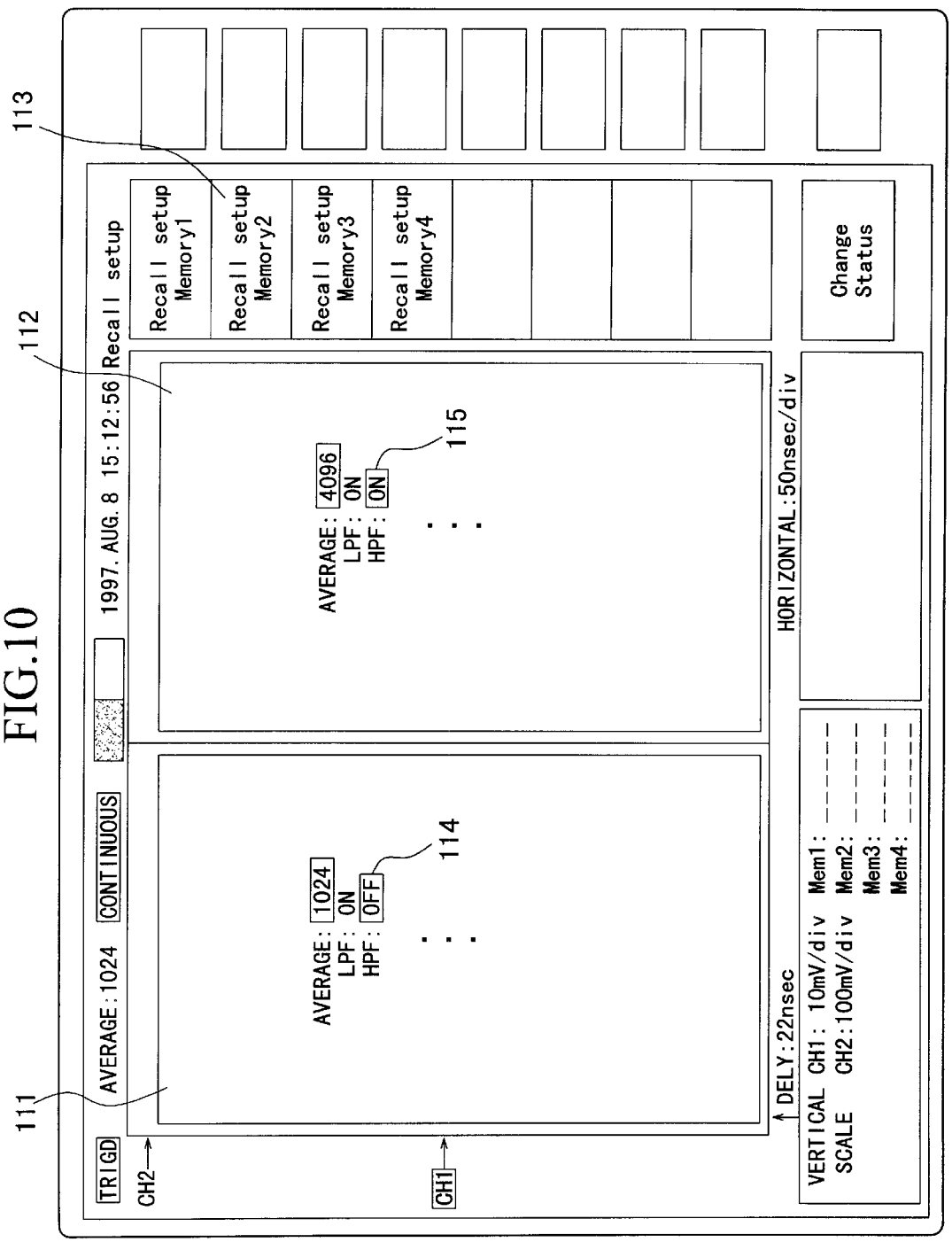
FIG. 10 shows an example of images which are displayed on the screen in connection with the embodiment 3.

After completion of the steps S32 and S33, the data processor 31 proceeds to step S34, wherein the measurement condition display section 53 displays the selected measurement conditions, while the emphasizing display processing section 54 performs an emphasizing display process to emphasize different parts between the measurement conditions of the measurement data which are compared with each other. FIG. 10 shows an example of images displayed on the screen in accordance with the embodiment 3. In FIG. 10, a display area 111 displays the measurement conditions of the measurement data which are selected in the step S32, while a display area 112 displays the measurement conditions of the subject measurement data which are selected in the step S33. FIG. 10 shows only one area for displaying the measurement conditions of the measurement data which are compared with the measurement data.

Next, operations of the measurement data display section 53 and operations of the emphasizing display processing section 54 will be described below with reference to FIG. 10.

At first, the measurement condition display section 53 reads the measurement conditions which are stored in the measurement data storage 36 in relation to the measurement data selected in the step S32. Then, it displays them on the display area 111 shown in FIG. 10. Next, the measurement condition display section 53 reads the measurement conditions which are stored in relation to the subject measurement data selected in the step S33. Then, it displays them on the display area 112 in FIG. 10.

As the measurement conditions, FIG. 10 shows a number of "AVERAGE", ON/OFF of "LPF" (low-pass filter) and ON/OFF of "HPF" (high-pass filter), for example. It is possible to further display other measurement conditions such as the specific measurement band of the EOS oscilloscope, detection sensitivity and bias value of the laser diode, which are not shown in FIG. 10. Incidentally, it is possible to display all the measurement conditions, or it is possible to display "necessary" measurement conditions only.

The emphasizing display processing section 54 compares the measurement conditions of the measurement data displayed on the display area 111 with the measurement conditions of the subject measurement data displayed on the display area 112. Then, it performs the emphasizing display process on the different parts between the measurement conditions with respect to the measurement conditions which are subjected to the display process by the measurement condition display section 53. For example, the emphasizing display process is effected in such a way that the different parts are displayed with different colors, netting or underlines, or they are flickered, for example.

Next, the data processor 31 interprets content of an operation which the user makes with the operation unit (not shown in FIG. 1). Thus, it performs a process in response to the content of the operation.

Suppose that the content of operation corresponds to an operation to display "another memory", by which measurement conditions of subject measurement data selected in the step S33 are to be displayed. Herein, the foregoing step S33 selects multiple measurement data as the subject measurement data. In that case, the data processor 31 proceeds to step S36. That is, the measurement condition display section 53 displays the measurement conditions of the subject measurement data. In addition, the emphasizing display processing section 54 performs an emphasizing display process to display different parts between the measurement conditions of the measurement data which are compared with each other. For example, when the user presses a button "113" displayed on the screen shown in FIG. 10, the display area 112 displays measurement conditions of the subject measurement data (e.g., second measurement data which are selected second within the multiple measurement data) stored in memory 2. Then, an emphasizing display process is performed on different parts between the measurement conditions of the measurement data which are compared with each other. Incidentally, the step S36 is approximately identical to the foregoing step S34. Specifically, however, the step S36 differs from the step S34 in that the step S36 does not display the measurement conditions of the measurement data selected in the step S32.

If the content of operation corresponds to an operation to select the measurement conditions which are subjected to the emphasizing display process, the data processor 31 transfers the selected measurement conditions and their items to the condition change section 55. In that case, the data processor 31 proceeds to step S37. That is, the condition change section 55 changes contents of the items to coincide with the measurement conditions transferred thereto. Further, the condition change section 55 performs a display process to change the contents of the items. For example, when the user designates an item "114" displayed in an emphasized manner on the screen shown in FIG. 10 by manipulating the operation unit (not shown), the condition change section 55 changes the setting of the measurement condition "HPF" (i.e., high-pass filter) of the EOS oscilloscope to coincide with content of an item "115" (i.e., "ON") of the subject measurement condition. Further, content of the item 114 is similarly changed from "OFF" to "ON". Incidentally, it is possible to provide a "collective change button" on the screen. When such a collective change button is pressed, the condition change section 55 collectively changes all of the measurement conditions set for the EOS oscilloscope to coincide with the measurement conditions of the subject measurement data which are selected in the step S33.

If the content of operation corresponds to "end", the data processor 31 ends execution of the steps of FIG. 10.

The data processor 31 of the embodiment 3 operates as described above.

As described above, the embodiment 3 is designed such that two sets of the measurement conditions are displayed in parallel, so it is possible to compare the measurement conditions with ease. In other words, it is possible for the user to easily grasp differences of the measurement conditions which are set in the past. In addition, the embodiment 3 is capable of emphasizing display of the items which correspond to different parts between the measurement conditions of the measurement data which are compared with each other. Thus, the user is capable of recognizing differences between the measurement conditions instantaneously.

Figure 9:
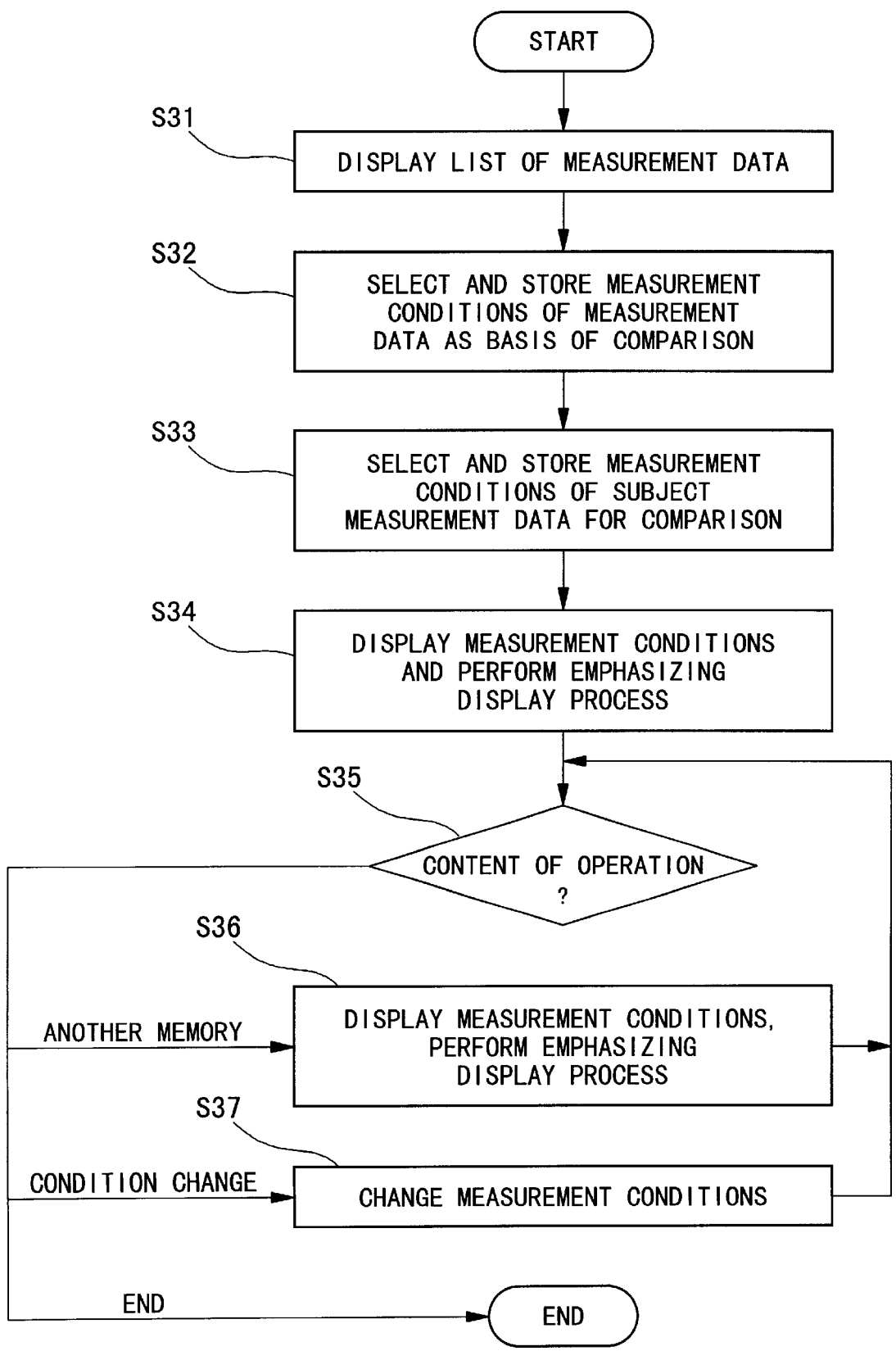
FIG. 9 is a flowchart showing operations of a data processor shown in FIG. 8.

Incidentally, the embodiment 3 can be modified such that the step S32 is excluded from the flowchart of FIG. 9. In that case, the measurement conditions presently set for the EOS oscilloscope are used as the measurement conditions which are selected in the foregoing step S32 and are displayed on the screen, for example. Thus, it is possible to compare the present measurement conditions with the previous measurement conditions which are used in the previous measurement. In this case, the condition change section 55 allows the user to change the present measurement conditions presently set for the EOS oscilloscope with the previous measurement conditions which are used in the previous measurement. Thus, it is possible to immediately start measurement with respect to the measured signals under the previous measurement conditions.

Incidentally, the aforementioned embodiment 1 can be modified to actualize functions of the embodiment 3. In that case, the step S33 shown in FIG. 9 is not performed, while the measurement conditions of the measurement data stored in the memory in the embodiment 1 are used as the subject measurement conditions.

In addition, the embodiment 3 can be modified to incorporate the comment processing section 34 used in the embodiment 1. In that case, the display areas 111 and 112 shown in FIG. 10 can be modified to have a capability to input and display comments, for example.

[D] Embodiment 4

All of the aforementioned embodiments 1, 2 and 3 are designed such that the display processing unit 10 is built in the main body 1 of the EOS oscilloscope. The embodiment 4 is designed such that all of the display processes described in the aforementioned embodiments 1, 2 and 3 are performed by another device, which is provided independently of the EOS oscilloscope.

FIG. 11 is a schematic diagram showing a configuration of an EOS oscilloscope system, which is designed in accordance with the embodiment 4 of the invention. The EOS oscilloscope system of FIG. 11 is configured by an EOS oscilloscope consisting of a main body 1 and an EOS probe as well as a display processing device 16.

The main body 1 of the EOS oscilloscope shown in FIG. 11 does not have the functions of the display processing unit 10, which are described with respect to the embodiments 1, 2 and 3. The main body 1 has only a function to store measurement data in the measurement data storage 36. The measurement data stored in the measurement data storage 36 are transmitted to the display processing device 16 by communications, or they are passed to the display processing device 16 by means of recording media such as the floppy disks. Thus, the display processing device 16 stores the measurement data. In addition, the display processing device 16 is capable of storing measurement conditions in relation to the measurement data according to needs. The display processing device 16 can be designed as the device exclusively used for the EOS oscilloscope system. Or, it is possible to use a computer system such as a personal computer as the display processing device 16. In that case, "computer-readable" recording media record programs which actualize the functions of the data processor 31, which are described with respect to the embodiments 1, 2 and 3. So, the programs recorded on the recording media are loaded into the computer system. Thus, the computer system runs the programs to perform the display processes related to the measurement data. Incidentally, the term "computer system" has a somewhat broad meaning which includes the software such as the operating system (OS) and the hardware such as the peripheral devices.

Incidentally, the aforementioned embodiments 1, 2 and 3 have been already described the contents of the display processes, which are performed in the display processing device 16. Hence, the embodiment 4 does not repeat the description regarding the contents of the display processes.

As described above, the embodiment 4 is designed to provide the display processing device 16 using the computer system independently of the EOS oscilloscope. So, it is possible to provide the display processing device 16 with relatively low cost. In addition, it is possible to add the embodiment 4 a process to save the selected measurement data with another name. In that case, the user may be capable of avoiding a mistake to overwrite data on previous data.

Incidentally, all of the four embodiments describe the display processes that deal with the measurement data exclusively produced by the EOS oscilloscope. However, this invention is not limited to those embodiments. That is, it is possible to perform the display processes on other measurement data which are produced by other oscilloscopes, for example.

As described heretofore, this invention has a variety of effects, which can be summarized as follows:

(1) This invention is designed to display an outline waveform based on a reduced number of sample points of the measurement data which are produced by the EOS oscilloscope and which are selected by the user. Using such an outline waveform which is displayed with respect to the selected measurement data, it is possible for the user to easily grasp content of the selected measurement data. So, it is possible to increase an efficiency in selecting the measurement data which are required.

(2) This invention is capable of displaying multiple outline waveforms, each of which is created based on a reduced number of sample points extracted from each of multiple measurement data, in parallel on the screen. Thus, it is possible for the user to easily grasp contents of the multiple measurement data respectively, and it is possible for the user to easily compare them together.

(3) Outline waveform data are created based on a reduced number of sample points extracted from the measurement data, so that an outline waveform is displayed based on the outline waveform data. Thus, it is possible to perform a display process on the outline waveform data at a high speed.

(4) This invention is capable of accepting comments input thereto with respect to the selected measurement data. The comments are stored in storage in relation to the measurement data. Thus, the user is capable of immediately inputting the comment that the user becomes aware with respect to the selected measurement data. So, the user is capable of recognizing content of the comment later. Therefore, it is possible to provide an effective way for use of the measurement data.

(5) This invention is capable of displaying measurement conditions of the measurement data produced by the EOS oscilloscope, so the measurement conditions are arranged on the screen with respect to the measurement data respectively. This enables the user to easily compare the measurement conditions of the different measurement data. In addition, it is possible for the user to easily grasp differences between the present measurement conditions and previous measurement conditions.

(6) This invention is capable of emphasizing display of the measurement conditions of the selected measurement data with respect to different parts by which two sets of the measurement conditions differ from each other. Thus, it is possible for the user to instantaneously recognize the differences of the measurement conditions which are compared with each other.

(7) This invention is capable of changing the measurement conditions presently set for the EOS oscilloscope to coincide with the measurement conditions of the subject measurement data which are selected by the user for comparison. Thus, it is possible to change the setting of the measurement conditions of the EOS oscilloscope to match with the previous setting of the measurement conditions which are set in the past. So, it is possible for the user to perform the measurement using the EOS oscilloscope under the previous measurement conditions speedily.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. An electro-optic sampling oscilloscope comprising:

measurement means for supplying an electro-optic crystal, connected with electric fields caused by measured signals, with laser beams so as to produce a plurality of measurement data including data for a number of sample points, the plurality of the measurement data representing waveforms of the measured signals, in response to polarization states of the laser beams; and display processing means for performing a display process on the plurality of measurement data, wherein said display processing means comprises measurement data storage means for storing the plurality of measurement data and for also storing information in relation to the plurality of measurement data, list display means for displaying a list of files of the plurality of measurement data stored in the measurement data storage means in order to allow a user to select specific measurement data to be displayed within the plurality of measurement data, and outline waveform display means for displaying an outline waveform based on a reduced number of sample points extracted from the selected specific measurement data.

2. The electro-optic sampling oscilloscope according to claim 1, wherein the outline waveform display means displays a plurality of outline waveforms, each of which is created based on a reduced number of sample points extracted from each of the measurement data of the plurality of measurement data which are respectively selected by the user, so that the plurality of outline waveforms are displayed and arranged on a screen.

3. The electro-optic sampling oscilloscope according to claim 2, wherein the display processing means further comprises outline waveform data creation means for creating outline waveform data based on a reduced number of sample points of the plurality of measurement data so as to store the outline waveform data in the measurement data storage means in relation to the plurality of measurement data, so that the outline waveform display means displays the outline waveform based on the outline waveform data, while the display processing means controls the outline waveform data creation means to newly create outline waveform data with respect to the specific measurement data which are selected by the user and for which the outline waveform display means displays an outline waveform based on the outline waveform data newly created.

4. The electro-optic sampling oscilloscope according to claim 1, wherein the display processing means further comprises outline waveform data creation means for creating outline waveform data based on the reduced number of sample points of the plurality of measurement data so as to store the outline waveform data in the measurement data storage means in relation to the plurality of measurement data, so that the outline waveform display means displays the outline waveform based on the outline waveform data, while the display processing means controls the outline waveform data creation means to newly create outline waveform data with respect to the specific measurement data which are selected by the user and for which the outline waveform data are not provided in advance, so that the outline waveform display means displays an outline waveform based on the outline waveformi data newly created.

5. The electro-optic sampling oscilloscope according to claim 4, wherein the display processing means further comprises comment processing means for storing a comment, which is input thereto with respect to measurement data chosen by the user, in the measurement data storage means in relation to the selected specific measurement data, so that the outline waveform display means displays the comment which is stored in the measurement data storage means in relation to the chosen measurement data.

6. The electro-optic sampling oscilloscope according to claim 1, wherein the display processing means further comprises comment processing means for storing a comment, which is input thereto with respect to measurement data chosen by the user, in the measurement data storage means in relation to the selected specific measurement data, so that the outline waveform display means displays the comment which is stored in the measurement data storage means in relation to the chosen measurement data.

7. An electro-optic sampling oscilloscope comprising:
measurement means for supplying an electro-optic crystal, connected with electric fields caused by measured signals, with laser beams so as to produce a plurality of measurement data, representing waveforms of the measured signals, in response to polarization states of the laser beams; and
display processing means for performing a display process on the plurality of measurement data,
wherein said display processing means comprises
measurement data storage means for storing the plurality of measurement data and for also storing measurement conditions in relation to the plurality of measurement data respectively,
list display means for displaying a list of files of the plurality of measurement data stored in the measurement data storage means in order to allow a user to select specific measurement data whose measurement conditions are to be displayed within the plurality of measurement data, and
measurement condition display means for displaying the measurement conditions of the selected specific measurement data, wherein the measurement conditions are arranged on a screen with respect to each measurement data of the plurality of measurement data which are selected by the user.

8. The electro-optic sampling oscilloscope according to claim 7, wherein the display processing means further comprises emphasizing display processing means for emphasizing display of the measurement conditions of the plurality of measurement data which are displayed by the measurement condition display means with respect to different parts between the measurement conditions of the selected specific measurement data which are compared with each other.

9. The electro-optic sampling oscilloscope according to claim 8, wherein the display processing means further comprises condition change means for changing measurement conditions presently set with measurement conditions of subject measurement data for comparison with respect to the different parts, emphasized by the emphasizing display processing means, which are selected by the user.

10. The electro-optic sampling oscilloscope according to claim 7 wherein the measurement conditions to be displayed include the presence or absence of a filter.

11. The electro-optic sampling oscilloscope according to claim 7 wherein the measurement conditions to be displayed include the measurement band.

12. The electro-optic sampling oscilloscope according to claim 7 wherein the measurement conditions to be displayed include the detection sensitivity.

13. The electro-optic sampling oscilloscope according to claim 7 wherein the measurement conditions to be displayed include a bias value of a laser diode.

14. An electro-optic sampling oscilloscope system comprising:
an electro-optic sampling oscilloscope for supplying an electro-optic crystal, connected with electric fields caused by measured signals, with laser beams so as to produce a plurality of measurement data, including data for a number of sample points, the plurality of measurement data representing waveforms of the measured signals, in response to polarization states of the laser beams; and
a display processing device for performing a display process on the plurality of measurement data produced by the electro-optic sampling oscilloscope,
wherein said display processing device comprises
measurement data storage means for storing the plurality of measurement data and for also storing information in relation to the plurality of measurement data,
list display means for displaying a list of files of the plurality of measurement data stored in the measurement data storage means in order to allow a user to select specific measurement data to be displayed within the plurality of measurement data, and
outline waveform display means for displaying an outline waveform based on a reduced number of sample points extracted from the selected specific measurement data.

15. An electro-optic sampling oscilloscope system comprising:
an electro-optic sampling oscilloscope for supplying an electro-optic crystal, connected with electric fields caused by measured signals, with laser beams so as to produce a plurality of measurement data, representing waveforms of the measured signals, in response to polarization states of the laser beams; and a display processing device for performing a display process on the plurality of measurement data produced by the electro-optic sampling oscilloscope, wherein said display processing device comprises measurement data storage means for storing the plurality of measurement data and for also storing measurement conditions in relation to the plurality of measurement data respectively, list display means for displaying a list of files of the plurality of measurement data stored in the measurement data storage means in order to allow a user to select specific measurement data whose measurement conditions are to be displayed within the plurality of measurement data, and measurement condition display means for displaying the measurement conditions of the selected specific measurement data, wherein the measurement conditions are arranged on a screen with respect to each measurement data of the plurality of measurement data which are selected by the user.

16. A measurement data display method for an electro-optic sampling oscilloscope comprising the steps of:

supplying an electro-optic crystal, connected with electric fields caused by measured signals, with laser beams so as to produce a plurality of measurement data, including data for a number of sample points, the plurality of measurement data representing waveforms of the measured signals, in response to polarization states of the laser beams, storing the plurality of measurement data while also storing information in relation to the plurality of measurement data respectively, displaying a list of files of the plurality of measurement data which are stored in order to allow a user to select specific measurement data to be displayed within the plurality of measurement data, and displaying an outline waveform based on a reduced number of sample points extracted from the selected specific measurement data.

17. A measurement data display method for an electro-optic sampling oscilloscope comprising the steps of:

supplying an electro-optic crystal, connected with electric fields caused by measured signals, with laser beams so as to produce a plurality of measurement data, representing waveforms of the measured signals, in response to polarization states of the laser beams, storing the plurality of measurement data while also storing measurement conditions in relation to the plurality of measurement data respectively, displaying a list of files of the plurality of measurement data which are stored in order to allow a user to select specific measurement data whose measurement conditions are to be displayed within the plurality of measurement data, and displaying the measurement conditions of the selected specific measurement data, wherein the measurement conditions are arranged on a screen with respect to each measurement data of the plurality of measurement data.

18. A computer-readable media storing a measurement data display program that causes a computer to perform a measurement data display method on an electro-optic sampling oscilloscope, the measurement data display method comprising the steps of:

supplying an electro-optic crystal, connected with electric fields caused by measured signals, with laser beams so as to produce a plurality of measurement data, including data for a number of sample points, the plurality of measurement data representing waveforms of the measured signals, in response to polarization states of the laser beams, storing the plurality of measurement data while also storing information in relation to the plurality of measurement data respectively, displaying a list of files of the plurality of measurement data which are stored in order to allow a user to select specific measurement data to be displayed within the plurality of measurement data, and displaying an outline waveform based on a reduced number of sample points extracted from the selected specific measurement data.

19. A computer-readable media storing a measurement data display program that causes a computer to perform a measurement data display method on an electro-optic sampling oscilloscope, the measurement data display method comprising the steps of:

supplying an electro-optic crystal, connected with electric fields caused by measured signals, with laser beams so as to produce a plurality of measurement data, representing waveforms of the measured signals, in response to polarization states of the laser beams, storing the plurality of measurement data while also storing measurement conditions in relation to the plurality of measurement data respectively, displaying a list of files of the plurality of measurement data which are stored in order to allow a user to select specific measurement data whose measurement conditions are to be displayed within the plurality of measurement data, and displaying the measurement conditions of the selected specific measurement data, wherein the measurement conditions are arranged on a screen with respect to each measurement data of the plurality of measurement data.

20. An electro-optic sampling oscilloscope comprising:

an electro-optic probe containing an electro-optic crystal which is placed under effect of an electric field caused by a measured signal;

laser pulse supply means for supplying laser pulses to the electro-optic crystal wherein the laser pulses are subjected to polarization;

measurement data producing means for producing a plurality of measurement data, including data for a number of sample points, the plurality of measurement data representative of a waveform of the measured signal, in response to polarization states of the laser pulses which are returned from the electro-optic probe; and display processing means for processing the measurement data to display an outline waveform which is created based on a reduced number of sample points extracted from the measurement data.

21. The electro-optic sampling oscilloscope according to claim 20 wherein the display processing means comprises a data processor for processing the measurement data to produce the outline waveform, and a measurement data storage for storing the measurement data and for storing information in relation to the measurement data.

22. The electro-optic sampling oscilloscope according to claim 21 wherein the information corresponds to a comment which is input in connection with the measurement data.

23. The electro-optic sampling oscilloscope according to claim 21 wherein the information correspond to measurement conditions which are used for measurement to produce the measurement data.

* * * * *